United States Patent
Chien

(10) Patent No.: US 11,213,877 B2
(45) Date of Patent: Jan. 4, 2022

(54) MANUFACTURING METHOD FOR A FINISHED PRODUCT OF A HEAT SINK COMPOSITE HAVING HEAT DISSIPATION FUNCTION

(71) Applicant: TRUSVAL TECHNOLOGY CO., LTD., Chu-Nan Township (TW)

(72) Inventor: Shih Pao Chien, Chu-Nan Township (TW)

(73) Assignee: Trusval Technology Co., Ltd., Miao-Li County (TW)

( * ) Notice: Subject to any disclaimer, the term of this patent is extended or adjusted under 35 U.S.C. 154(b) by 0 days.

(21) Appl. No.: 17/122,295

(22) Filed: Dec. 15, 2020

(65) Prior Publication Data
US 2021/0094087 A1    Apr. 1, 2021

Related U.S. Application Data

(62) Division of application No. 16/421,751, filed on May 24, 2019, now abandoned.

(51) Int. Cl.
| | |
|---|---|
| *B21D 53/02* | (2006.01) |
| *H01L 23/373* | (2006.01) |
| *H01L 23/427* | (2006.01) |
| *B23P 15/26* | (2006.01) |
| *B32B 37/18* | (2006.01) |
| *F28F 21/02* | (2006.01) |

(52) U.S. Cl.
CPC .............. *B21D 53/02* (2013.01); *B23P 15/26* (2013.01); *H01L 23/3735* (2013.01); *H01L 23/427* (2013.01); *B32B 37/18* (2013.01); *F28F 21/02* (2013.01); *F28F 2255/06* (2013.01); *F28F 2275/025* (2013.01); *Y10T 29/49366* (2015.01)

(58) Field of Classification Search
CPC ...... B21D 53/02; B23P 15/26; B23P 2700/10; Y10T 29/49366; Y10T 29/49787; B32B 37/18
See application file for complete search history.

(56) References Cited

U.S. PATENT DOCUMENTS

| | | | | |
|---|---|---|---|---|
| 3,327,779 | A * | 6/1967 | Hull ........................ | F28F 1/122 165/185 |
| 6,684,925 | B2 * | 2/2004 | Nagate ..................... | G03C 1/74 156/540 |
| 6,908,784 | B1 * | 6/2005 | Farnworth ........ | H01L 21/76898 438/106 |
| 6,919,504 | B2 * | 7/2005 | McCutcheon ...... | F28D 15/0241 174/16.3 |
| 7,243,703 | B2 * | 7/2007 | Yamaguchi ............... | F28F 3/14 165/41 |

(Continued)

Primary Examiner — Jason L Vaughan
(74) Attorney, Agent, or Firm — Rosenberg, Klein & Lee

(57) ABSTRACT

The invention relates to a manufacturing process for a heat dissipation heat sink composite having heat dissipation function and a manufacturing method for a finished product thereof. It comprises the steps of rolling a first heat conductive material and a substrate to adhere the first heat conductive material to the substrate for fixation; adhering a second heat conductive material to the substrate for combination; and rolling the second heat conductive material and the substrate for firmly combination and fixation to complete the manufacturing of a composite material.

3 Claims, 10 Drawing Sheets

(56) References Cited

U.S. PATENT DOCUMENTS

| | | | | |
|---|---|---|---|---|
| 7,467,467 B2* | 12/2008 | Prociw | .................... | B22F 7/004 29/890.03 |
| 7,797,808 B2* | 9/2010 | Zhang | .................... | B32B 27/06 29/458 |
| 8,323,996 B2* | 12/2012 | Koller | ............... | H01L 21/76898 438/26 |
| 8,946,894 B2* | 2/2015 | Railkar | ............... | H01L 23/3735 257/747 |
| 9,349,670 B2* | 5/2016 | Zhou | .................... | H01L 21/568 |
| 9,581,282 B1* | 2/2017 | Ward | .................... | B32B 29/005 |
| 10,041,746 B2* | 8/2018 | Riendeau | ............... | B23P 15/26 |
| 10,315,401 B2* | 6/2019 | Hong | .................... | C01B 32/194 |
| 10,741,519 B2* | 8/2020 | Strader | ................ | B32B 37/025 |
| 10,781,142 B2* | 9/2020 | Li | ....................... | C04B 35/6265 |
| 11,014,203 B2* | 5/2021 | Kittel | ............... | H01L 21/67132 |
| 2006/0183298 A1* | 8/2006 | Schulz-Harder | .... | H01L 21/4807 438/460 |
| 2007/0158050 A1* | 7/2007 | Norley | .................... | H01L 24/32 165/80.4 |
| 2009/0092747 A1* | 4/2009 | Zhamu | .................... | H01G 11/38 427/80 |
| 2010/0081057 A1* | 4/2010 | Liu | ....................... | H01M 4/587 429/231.5 |
| 2014/0116661 A1* | 5/2014 | Xu | ........................... | G06F 1/20 165/133 |
| 2014/0367847 A1* | 12/2014 | Strader | ................ | H01L 23/427 257/717 |
| 2014/0378294 A1* | 12/2014 | Corral | .................... | C04B 35/584 501/99 |
| 2016/0185074 A1* | 6/2016 | Kagawa | ................ | B32B 9/048 428/341 |
| 2016/0332136 A1* | 11/2016 | Zhang | .................... | B01J 20/02 |
| 2017/0233613 A1* | 8/2017 | Bogner | ............... | H01L 23/3737 165/133 |
| 2018/0162098 A1* | 6/2018 | Joo | ......................... | B32B 15/08 |
| 2018/0250779 A1* | 9/2018 | Sailer | ..................... | B23P 15/26 |
| 2018/0339493 A1* | 11/2018 | Chen | .................... | H05K 1/0353 |
| 2019/0329367 A1* | 10/2019 | Tsai | ....................... | B65H 35/10 |
| 2020/0051889 A1* | 2/2020 | Terao | ..................... | B32B 15/01 |
| 2020/0164620 A1* | 5/2020 | Liu | ......................... | C22C 21/00 |

* cited by examiner

US 11,213,877 B2

1

MANUFACTURING METHOD FOR A FINISHED PRODUCT OF A HEAT SINK COMPOSITE HAVING HEAT DISSIPATION FUNCTION

REFERENCE TO RELATED APPLICATIONS

This application is a Division of application Ser. No. 16/421,751, filed 24 May 2019, currently pending.

BACKGROUND OF THE INVENTION

1. Field of the Invention

The present invention relates to a manufacturing process for a heat dissipation heat sink composite having heat dissipation function and a manufacturing method for a finished product thereof, which enables to increase efficiency of 3-dimentional heat dissipation and electromagnetic radiation absorption, maintain a long service life with high performance, reduce a manufacturing cost, and have environmental friendly effect due to its recyclability.

2. Description of Related Art

With the rapid development of technology, the volume of electronic components tends to be decreased, and the density and performance of electronic components per unit area become increased. As a result, a total heat generation of the electronic component is yearly increased, and a traditional heat dissipating device cannot afford to dissipate the total heat generation quickly. If the heat generated by the electronic component is not removed efficiently, it will leads to an electronic ionization and a thermal stress situation of the electronic component, which reduces an overall stability and a service life of the electronic component. Accordingly, it is imperative to dissipate the heat generated from the electronic component to prevent an overheat situation thereof. In addition, constantly increasing the frequency and transmission speed of electronic components also results in serious situations of electromagnetic interference and electromagnetic wave spillover.

SUMMARY OF THE INVENTION

In view of the above-mentioned problems, the object of the present invention is to provide a manufacturing process for a heat dissipation heat sink composite having heat dissipation function and a manufacturing method for a finished product thereof, which enables to increase efficiency of 3-dimentional heat dissipation and electromagnetic radiation absorption, maintain a long service life with high performance, reduce a manufacturing cost, and have environmental friendly effect due to its recyclability.

2

Figure 4:
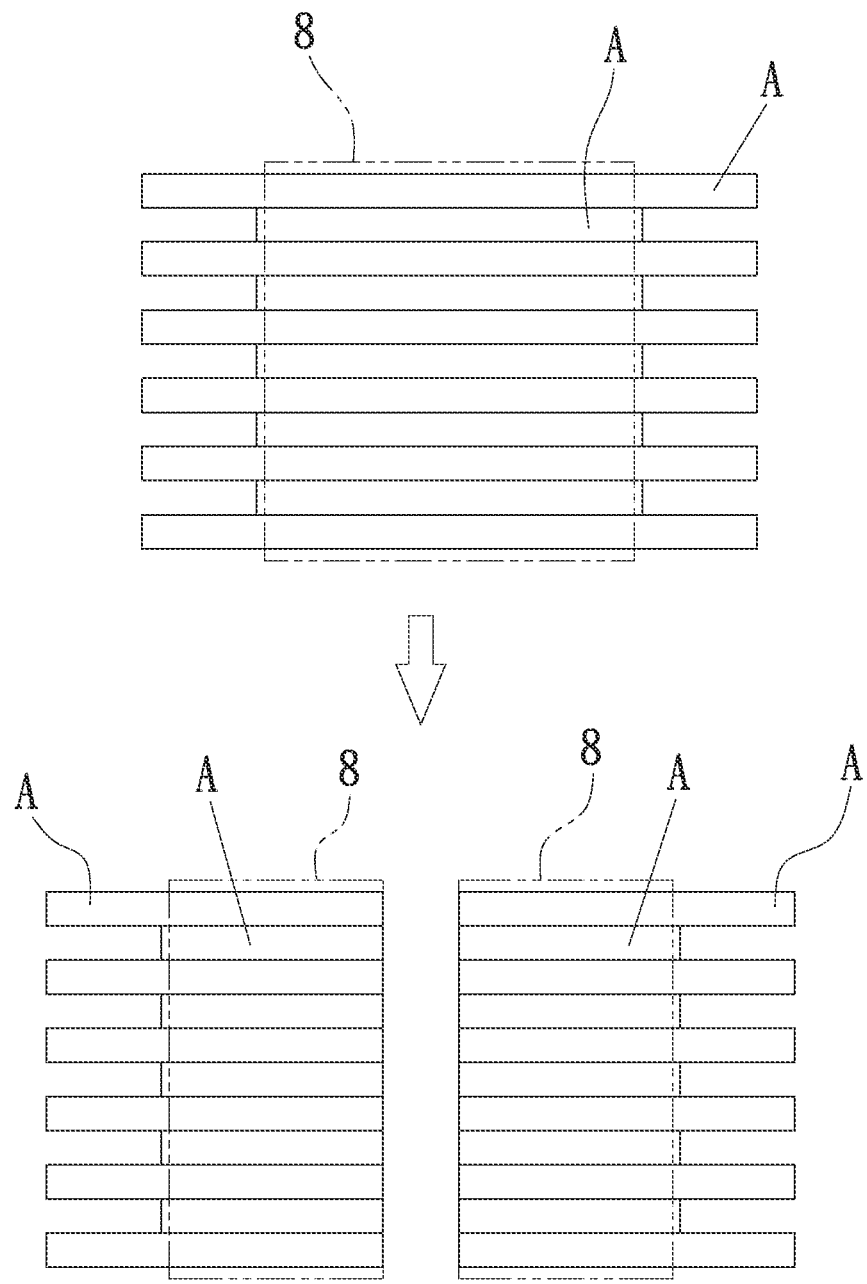
Figure 5:
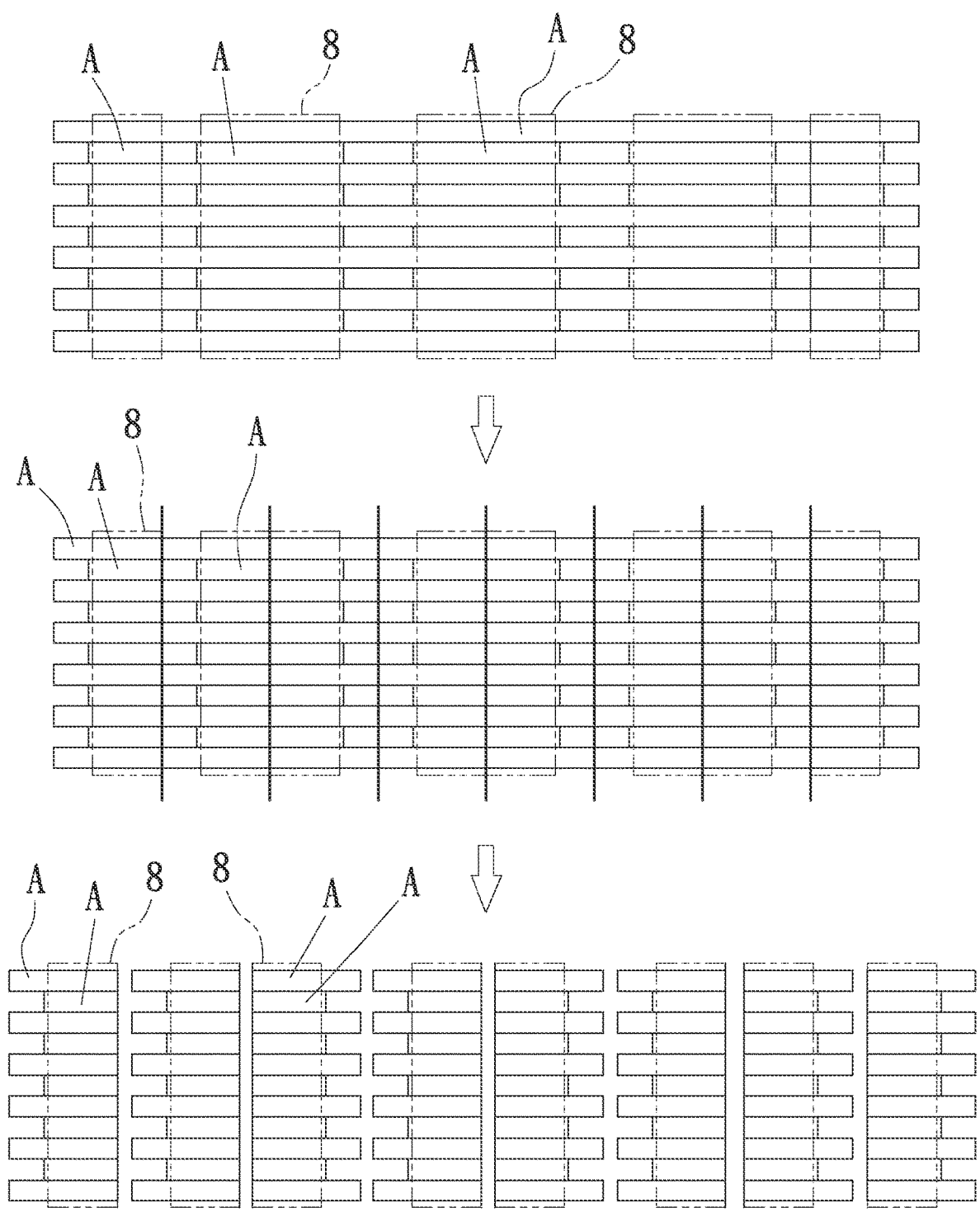
Figure 6:
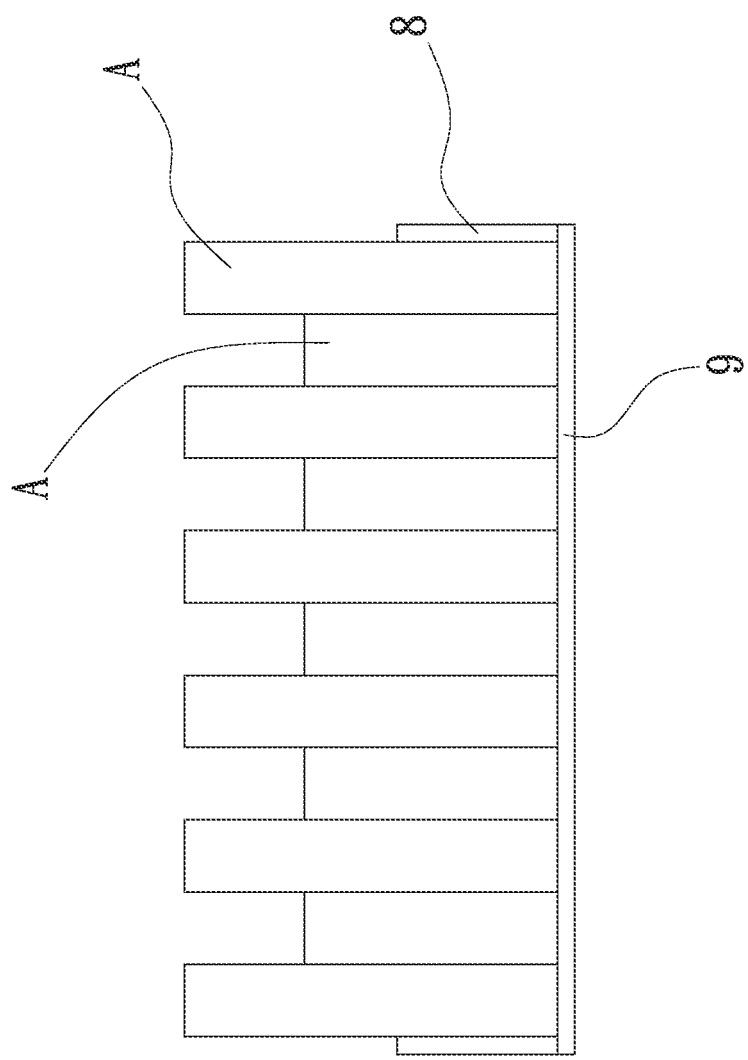
Figure 7:
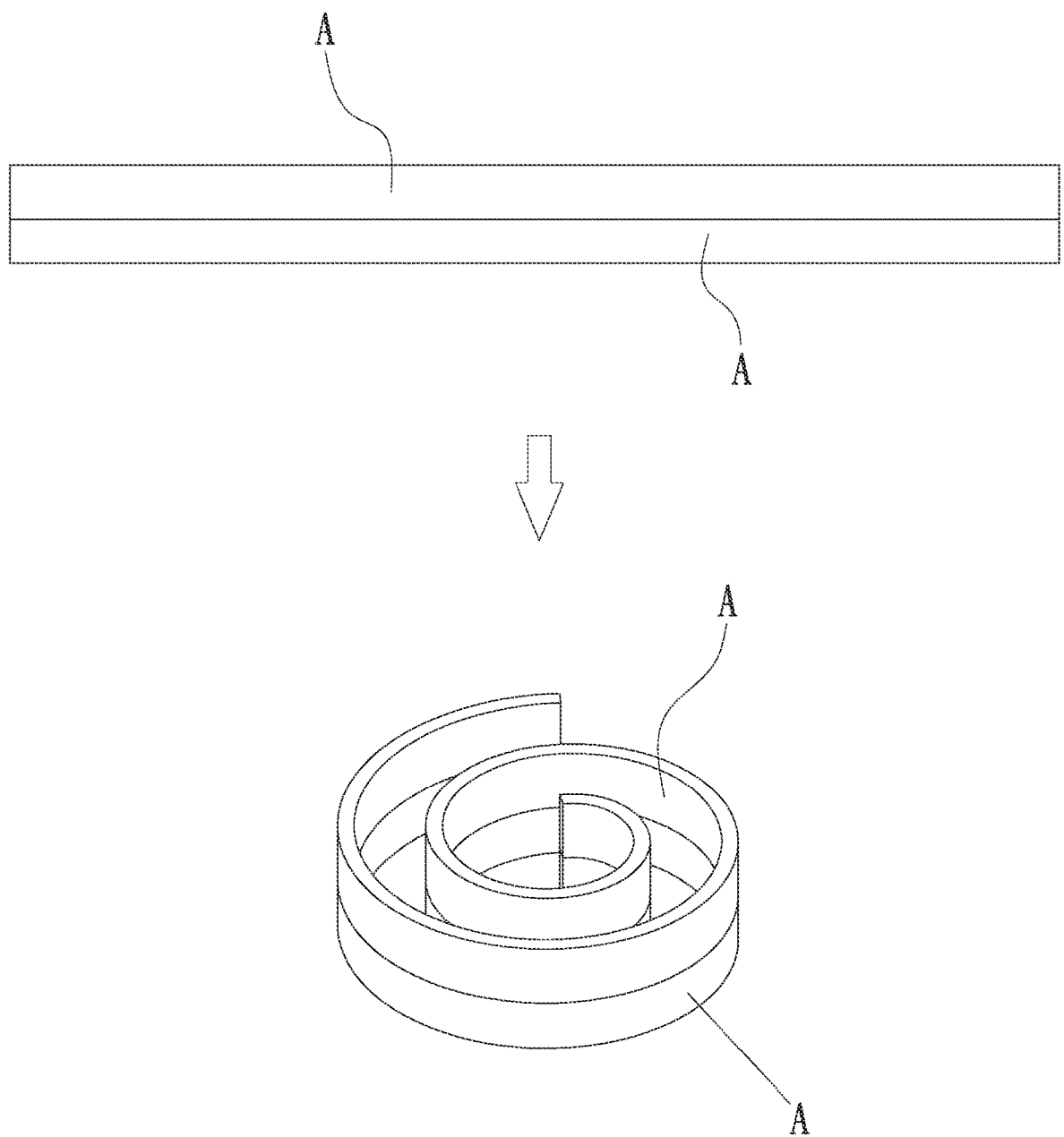
Figure 8:
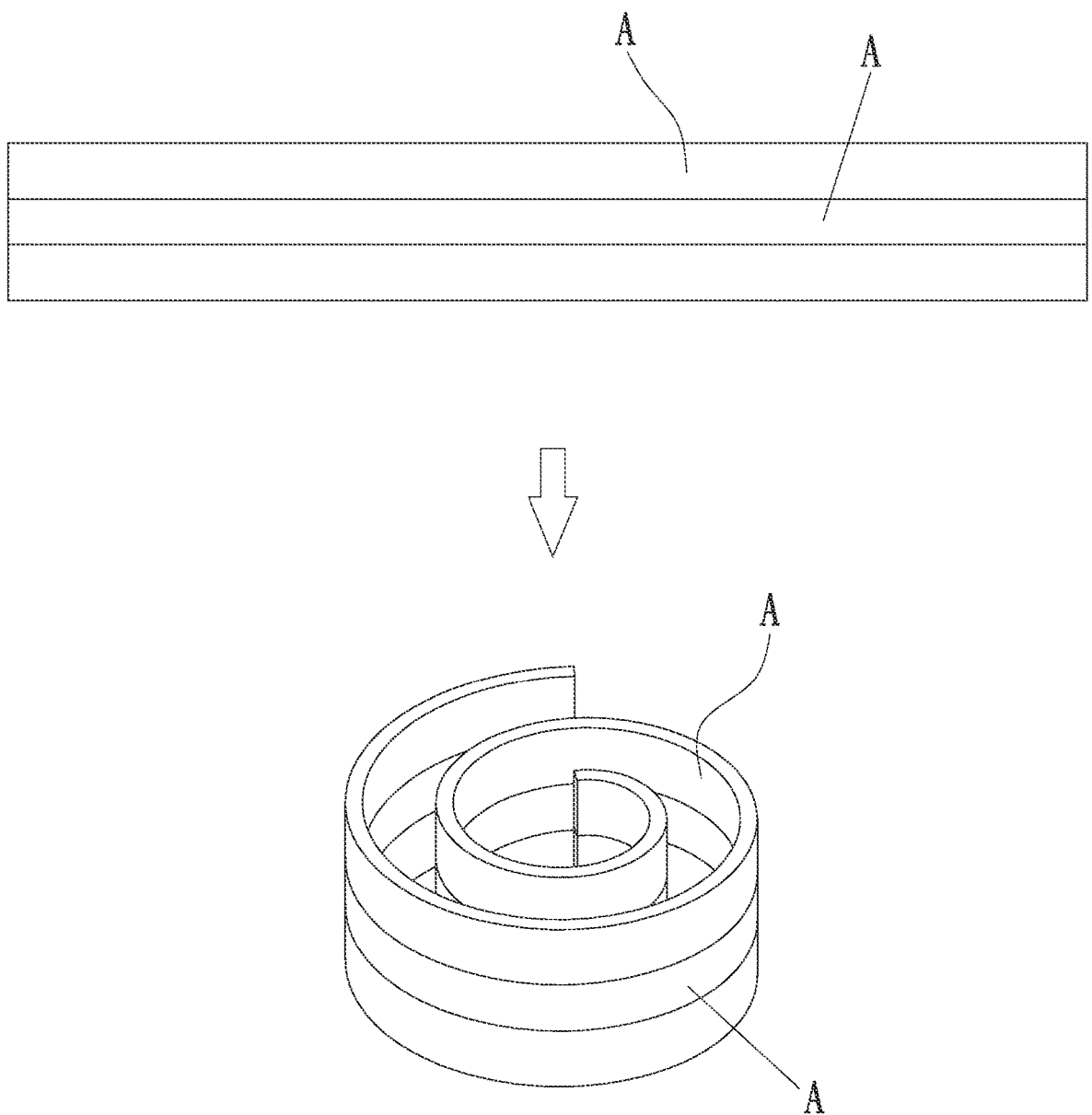
Figure 9:
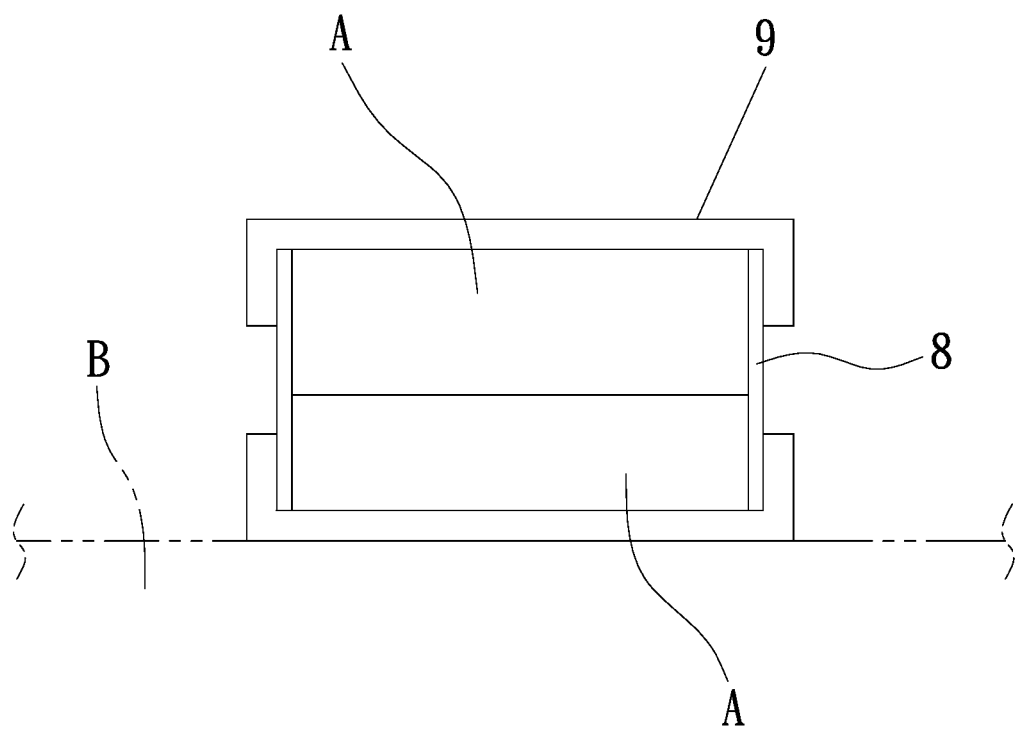
Figure 10:
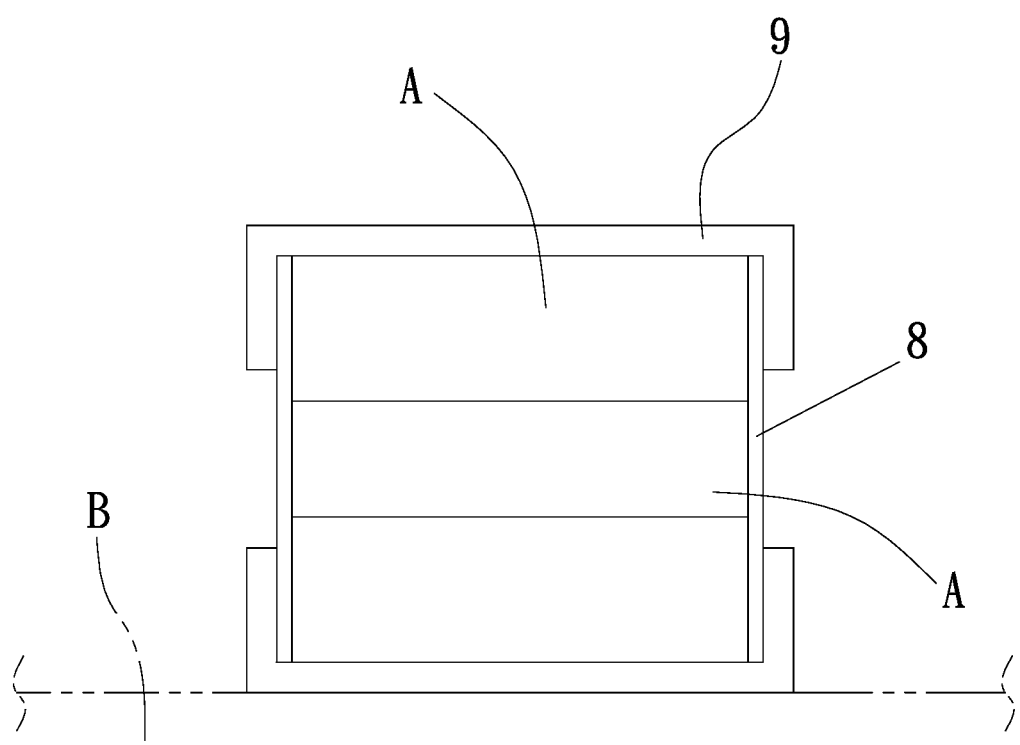

FIG. 4 is a first schematic diagram showing a heat sink composite bound and fixed by a heat-resistant insulating tape to be further cut to a size as needed;

FIG. 5 is a second schematic diagram showing a heat sink composite bound and fixed by a heat-resistant insulating tape to be further cut to a size as needed;

FIG. 6 is a schematic diagram showing a plurality of heat sink composites bonded to an insulating silicone elastic interface material for contacting a component to be cooled;

FIG. 7 is a schematic diagram showing a first embodiment for a plurality of heat sink composites wound to a predetermined number of layers;

FIG. 8 is a schematic diagram showing a second embodiment for a plurality of heat sink composites wound to a predetermined number of layers;

FIG. 9 is a schematic diagram showing the first embodiment for the plurality of heat sink composites further bonded to two insulating silicone elastic interface materials for contacting a component to be cooled;

FIG. 10 is a schematic diagram showing the second embodiment for the plurality of heat sink composites further bonded to two insulating silicone elastic interface materials for contacting a component to be cooled.

DETAILED DESCRIPTION OF THE PREFERRED EMBODIMENT

Hereinafter, an exemplary embodiment of the present invention will be described in detail with reference to the accompanying drawings.

Figure 1:
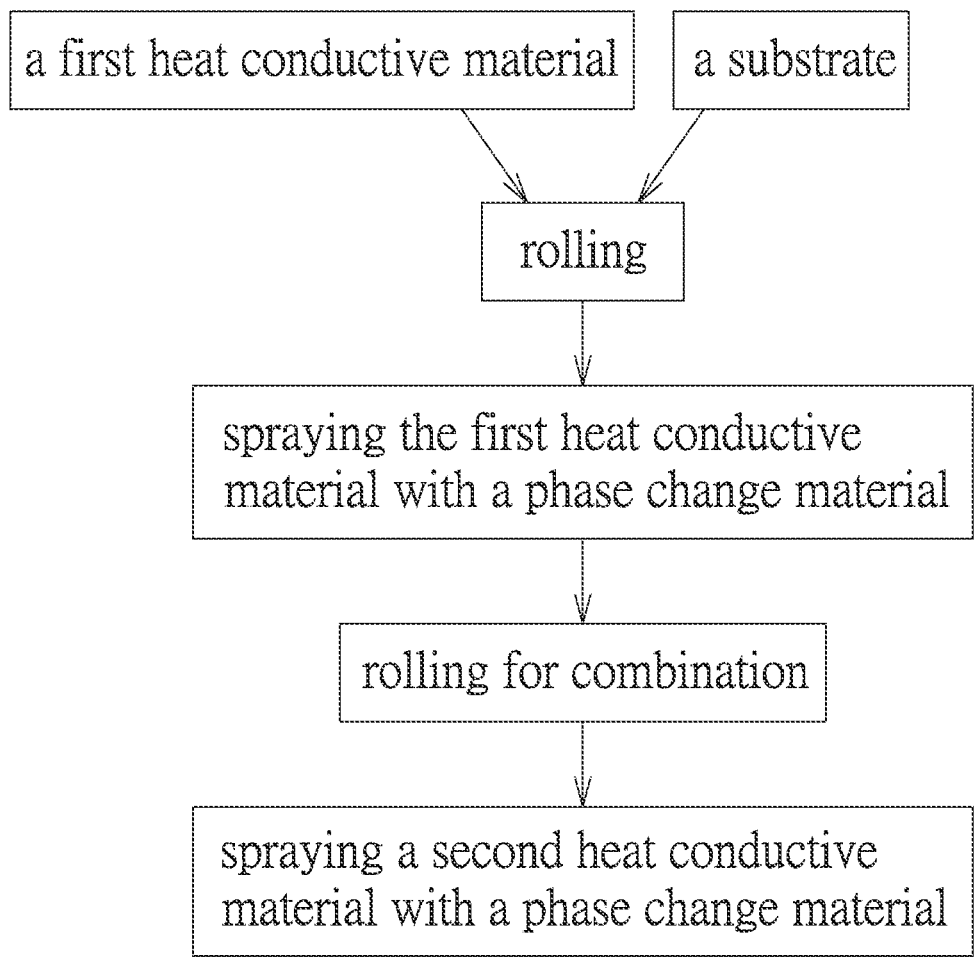
FIG. 1 is a flow chart showing a manufacturing process for a heat sink composite having heat dissipation function according to the present invention.
Figure 2:
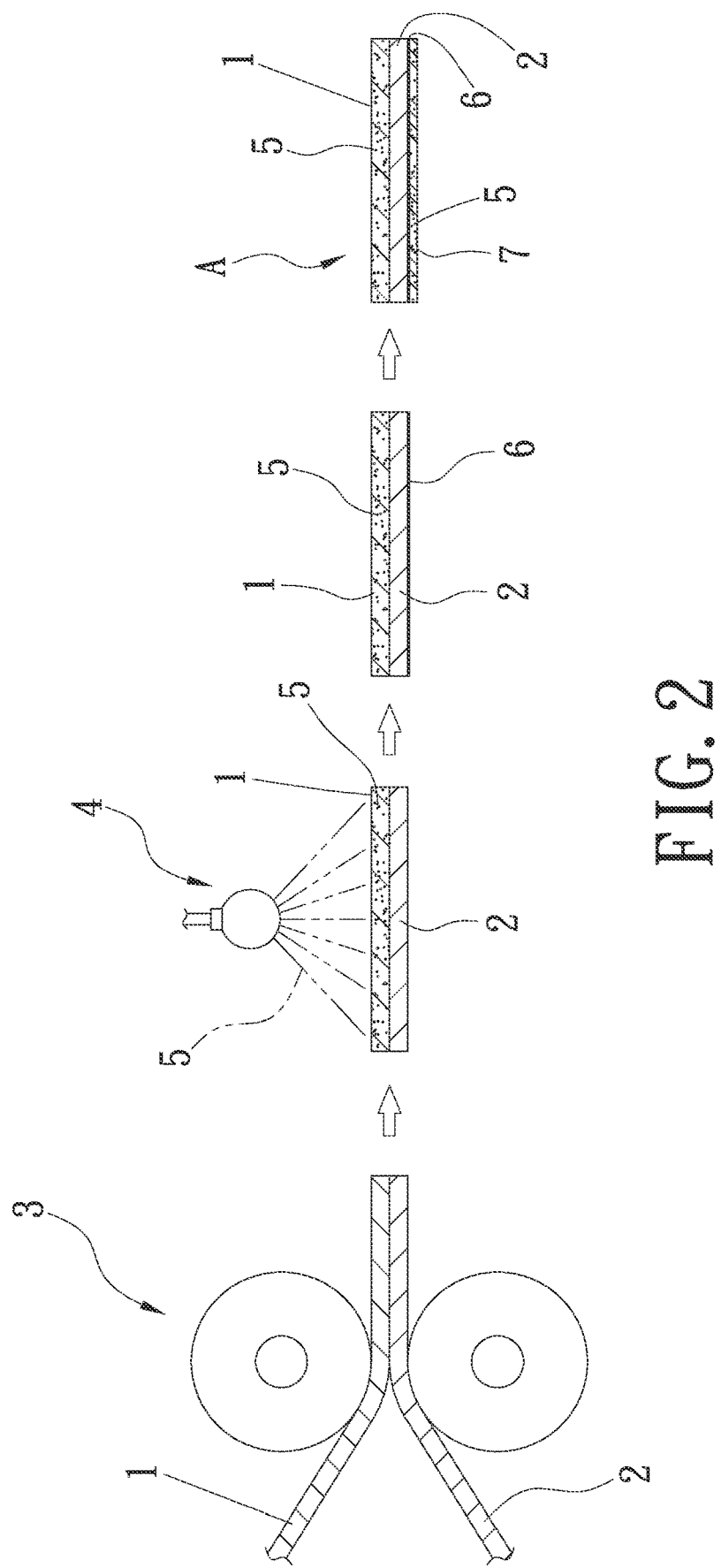
FIG. 2 is a schematic diagram showing a manufacturing process for a heat sink composite having heat dissipation function according to the present invention.
Figure 3:
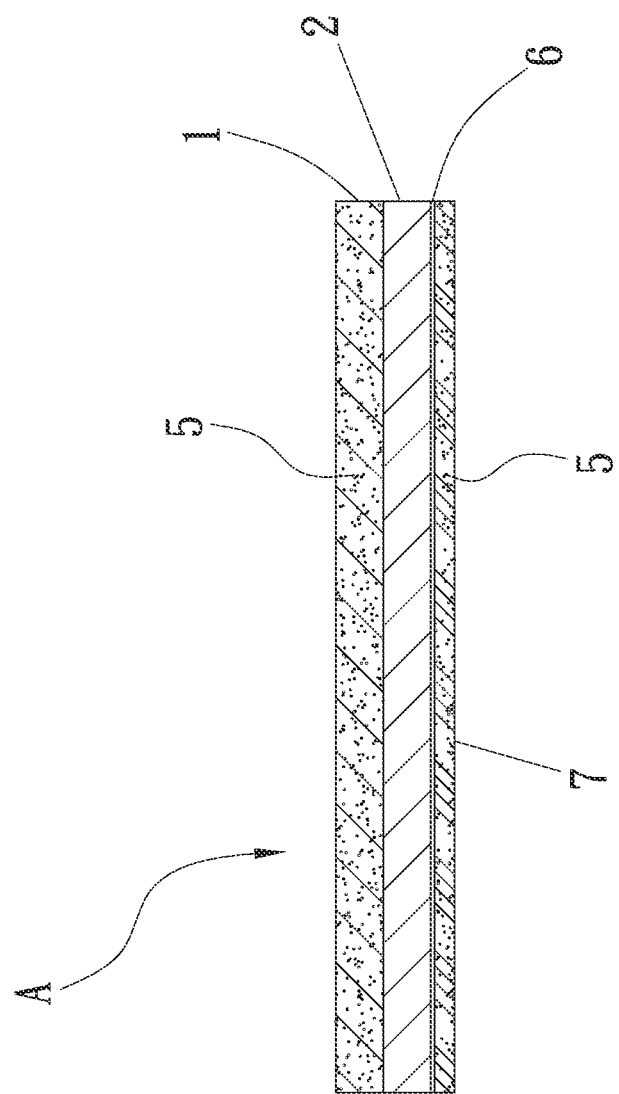
FIG. 3 is a sectional view showing a heat sink composite having heat dissipation function according to the present invention.

As showed in FIG. 1 and FIG. 2, a manufacturing process for a heat sink composite having heat dissipation function according to the present invention is disclosed. It mainly comprises the following steps of:

(a) transferring a first heat conductive material (1) and a substrate (2); preferably, the first heat conductive material (1) is selected from a group consisting of graphite oxide, graphene oxide and carbon materials with functional groups and shaped as a thin film, a flake or a roll, and the substrate (2) is a metal film, a metal mesh, a metal sheet, an inorganic film, an inorganic mesh, an organic film, an organic mesh or a non-woven fabric;

(b) rolling the first heat conductive material (1) and the substrate (2) under a high pressure by a rolling mechanism (3) to adhere the substrate (2) on one side of the first heat conductive material (1) for fixation;

(c) spraying the other side of the first heat conductive material (1) with an organic or inorganic phase change material (5) by a spraying mechanism (4) for firmly combining the phase change material (5) to the first heat conductive material (1);

(d) adhering one side of a second heat conductive material (7) to the substrate (2) by use of its inherent functional groups for combination, or by use of spraying an organic adhesive (6) on an outer surface of the substrate (2) for drying to form adhesiveness and for further bonding the organic adhesive (6) to the second heat conductive material (7), and then rolling the second heat conductive material (7) and the substrate (2) by a high pressure to be firmly bonded to each other so as to complete the preparation of a heat sink composite (A); preferably, the second heat conductive material (7) is selected from a group consisting of graphite oxide, graphene oxide and carbon materials with functional groups and shaped as a thin film, a flake or a roll; and (e) spraying the other side of the second heat conductive material (7) with an organic or inorganic phase change material (5) for firmly combining the phase change material (5) to the second heat conductive material (7) as shown in FIG. 3.

In use of the present invention, referring to FIG. 4 and FIG. 5, a heat sink composite (A) is cut into a size as needed, and then the plurality of heat sink composites (A) of various sizes are combined and arranged to form an array. A heat-resistant insulating tape (8) is used to bind and fix the plurality of heat sink composites (A) to be further cut into a size as needed. Referring to FIG. 6, an insulating silicone elastic interface material (9) is used to bond the plurality of heat sink composites (A) to a component to be cooled so as to achieve excellent heat dissipation.

Referring to FIG. 7 and FIG. 8, in step (a), a plurality of heat sink composites (A) having a predetermined size are arranged to form an array and then one ends of the plurality of heat sink composites (A) are fixed to a roll for winding. In step (b), after the plurality of heat sink composites (A) are wound up to a predetermined number of layers, a heat-resistant insulating tape (8) is used to bind and fix the plurality of heat sink composites (A). The plurality of heat sink composites (A) are taken off from the roll and then transferred into a vacuum annealing furnace for reduction and annealing. In step (c), after cooled down to room temperature, the plurality of heat sink composites (A) are transferred into a cutting mechanism for cutting into a size as needed. In step (d), the plurality of heat sink composites (A) are axially encapsulated. Finally, in step (e), the plurality of heat sink composites (A) are bonded to a component (B) to be cooled by use of an insulating silicone elastic interface material (9) as shown in FIG. 9 and FIG. 10 so as to achieve excellent heat dissipation.

Compared with the technique available now, the present invention has the following advantages:

1. The present invention increases efficiency of 3-dimentional heat dissipation and conduction and electromagnetic radiation absorption.

2. The present invention avoids the occurrence of oxidative damage, so it can maintain a long service life with high performance.

3. The present invention is easy to process and manufacture and has low loss and high yield rate, so it can reduce manufacturing cost.

4. The present invention has no environmental damage during the production process and achieves environmental friendly effect due to its recyclability.

What is claimed is:

1. A manufacturing method for a finished product of a heat sink composite having a heat dissipation function, comprising the following steps of:
   (a) cutting a heat sink composite in order to form a plurality of heat sink composites;
   (b) after the cutting, arranging the plurality of heat sink composites to form an array of heat sink composites;
   (c) binding and fixing the array of heat sink composites by a heat-resistant insulating tape; and
   (d) bonding the array of heat sink composites to a component, to be cooled, by use of an insulating silicone elastic interface material.

2. A manufacturing method for a finished product of a heat sink composite having a heat dissipation function, comprising the following steps of:
   (a) arranging a plurality of heat sink composites, having a predetermined size, in an array in order to form an array of heat sink composites;
   (b) winding the array of heat sink composites to a predetermined number of layers and binding and fixing the array of heat sink composites by a heat-resistant insulating tape;
   (c) after winding, cutting the array of heat sink composites into a desired size to form a sized array of heat sink composites;
   (d) axially encapsulating the sized array of heat sink composites; and
   (e) bonding the sized array of heat sink composites to a component, to be cooled, by use of an insulating silicone elastic interface material.

3. The manufacturing method for a finished product of the heat sink composite having heat dissipation function as claimed in claim 2, further comprising a step of moving the array of heat sink composites into a vacuum annealing furnace for reduction and annealing after the step (b) and before the step (c) as claimed in claim 2.

* * * * *